United States Patent [19]
Kunkel

[11] Patent Number: 6,122,701
[45] Date of Patent: Sep. 19, 2000

[54] DEVICE VOLUME CONTROL IN MULTIMODE COMPUTER SYSTEMS

[75] Inventor: Larry W. Kunkel, Houston, Tex.

[73] Assignee: Compaq Computer Corporation, Houston, Tex.

[21] Appl. No.: 08/988,640

[22] Filed: Dec. 11, 1997

[51] Int. Cl.[7] .............................. H03G 3/00; G06F 13/24; G06F 17/00

[52] U.S. Cl. ..................... 710/267; 710/260; 710/261; 700/94; 381/104

[58] Field of Search .............................. 381/109; 395/733, 395/734, 740, 868, 869, 825; 710/12, 62, 72, 65, 10, 267, 260, 261, 265, 266; 700/94

[56] References Cited

U.S. PATENT DOCUMENTS

| | | |
|---|---|---|
| 5,073,943 | 12/1991 | Chapman ................................. 381/86 |
| 5,095,526 | 3/1992 | Baum ...................................... 710/267 |
| 5,694,606 | 12/1997 | Pletcher et al. ......................... 710/261 |
| 5,872,995 | 2/1999 | Chaiken .................................. 395/825 |
| 5,956,680 | 9/1999 | Behnke et al. .......................... 704/258 |

*Primary Examiner*—Forester W. Isen
*Assistant Examiner*—Brian Tyrone Pendleton
*Attorney, Agent, or Firm*—Sharp, Comfort & Merrett, P.C.

[57] ABSTRACT

A volume control handler allows users to dynamically alter the volume level of an audio device when the device is under control of a DOS mode application. The dynamic volume adjustment is performed without pausing or halting the DOS mode application. A system incorporating the volume control handler allows users of DOS mode applications to control a device's volume output in a manner similar to that provided by WINDOWS-compliant applications.

38 Claims, 2 Drawing Sheets

DEVICE VOLUME CONTROL IN MULTIMODE COMPUTER SYSTEMS

BACKGROUND OF THE INVENTION

The invention generally relates to the control of peripheral devices in a computer system and, more particularly, to a system and method that provides dynamic control of a device's operating parameters. Dynamic control is achieved without pausing or halting an executing.

In computer systems executing under control of a modern operating system, volume control of audio generators, FM synthesizers, and other audio generating equipment can be effected by control buttons on the computer system's enclosure. An illustrative operating system that provides this capability is the WINDOWS operating system from Microsoft Corporation. In a WINDOWS-compatible application, pressing the control buttons generates a System Management Interrupt (SMI) which, in accordance with WINDOWS operating procedures, invokes a Basic Input-Output System (BIOS) routine that is designed to perform the specified task, e.g., increase or decrease the volume level.

A SMI is a non-maskable interrupt which is generally sent directly to the computer system's host processor. SMI routines are generally part of the BIOS and are designed to process events (e.g., depression of a volume-up button) in a very time efficient manner.

SUMMARY OF THE INVENTION

The invention, generally, provides apparatus and methods to process system management interrupt signals via a BIOS level handler. The handler allows control of a peripheral device parameter (e.g., volume), including auto-repeat capability, regardless of generating system mode.

Advantages of the invention include, but are not limited to, allowing the user to control the volume of a peripheral device under program control, without exiting the program, and regardless of the underlying operating systems mode.

DESCRIPTION OF THE PREFERRED EMBODIMENTS

Figure 1:
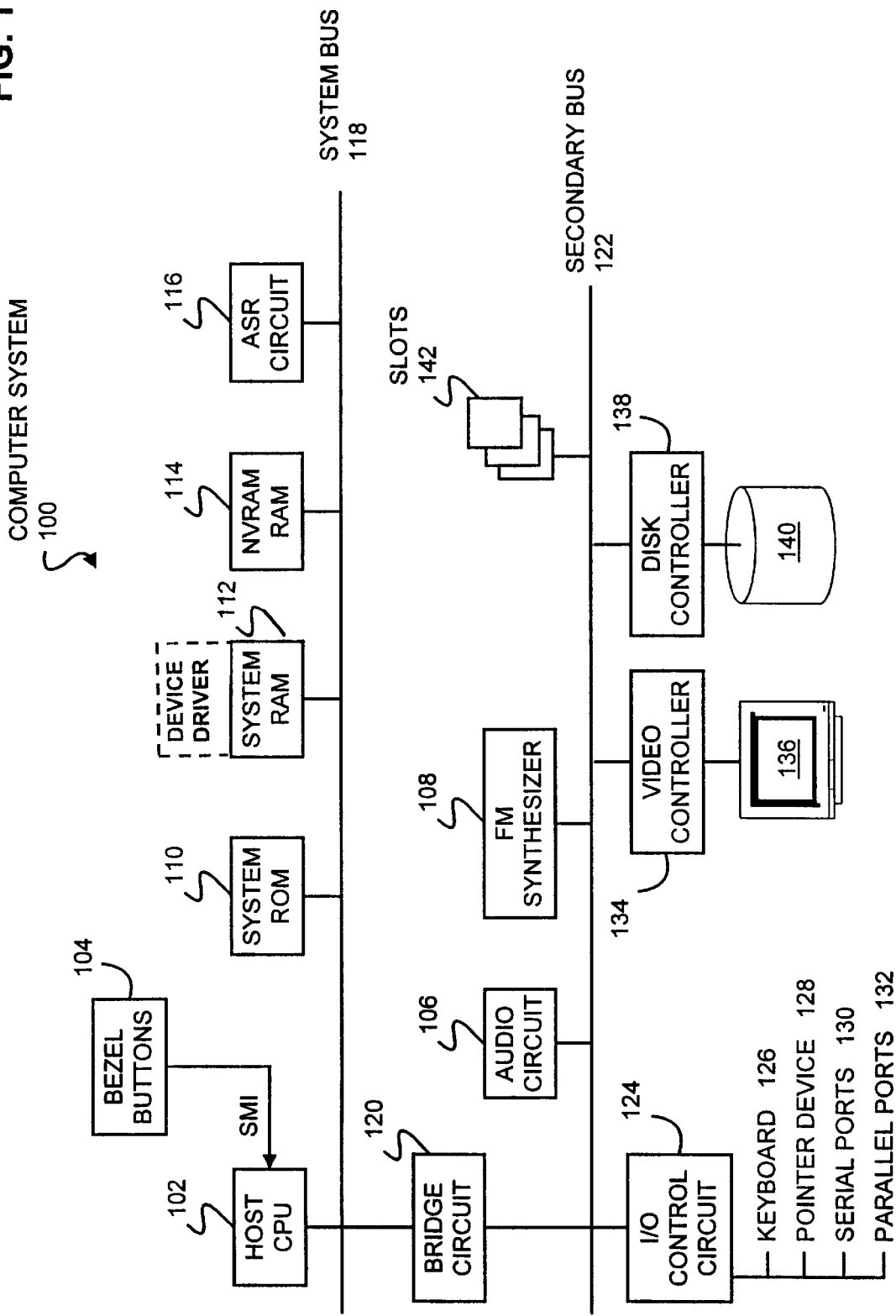
FIG. 1 illustrates a computer system providing dynamic control of an audio device parameter.

Referring initially to FIG. 1, an illustrative computer system 100 in accordance with the invention includes a host processor or CPU 102 having SMI input capability and control buttons 104 (hereinafter referred to as bezel buttons) coupled to the CPU's SMI input. Bezel buttons 104 may be on an external surface of a the computer system's enclosure or display monitor. In the illustrative computer system 100, the bezel buttons 104 implement volume-up and volume-down buttons for controlling an audio circuit 106 and/or an FM synthesizer 108. Illustrative host processors 102 include the PENTIUM and PENTIUM PRO family of processors from Intel Corporation.

The computer system 100 may also include Read Only Memory (ROM) 110, Random Access Memory (RAM) 112, non-volatile RAM (NVRAM) 114, and an Automatic System Recovery (ASR) circuit 116 connected to the system bus 118. System ROM 110 can use programmable versions of read only memory such as Electrically Erasable Programmable ROM (EEPROM). Non-Volatile RAM (NVRAM) 114 can be a CMOS memory device capable of retaining stored information after the system 100 is powered down. The system's SMI and Basic Input-Output System (BIOS) routines are generally stored in the NVRAM 114.

A bridge circuit 120 couples the system bus 118 to a secondary bus 122. The secondary bus could be, for example, a Peripheral Component Interface (PCI) bus, an Industry Standard Architecture (ISA) bus, an Extended Industry Standard Architecture (EISA) bus, or a combination of one or more of these buses. An input/output (I/O) control circuit 124 provides an interface for a user keyboard 126, a pointer device 128, and serial 130 and parallel 132 ports. Other components coupled to the secondary bus 122 include the audio generator circuit 106, the FM synthesizer 108, a video controller 134 and associated display 136, a disk controller 138 and associated disks (one shown) 140. The secondary bus 122 may also have slots 142 for additional components.

In the computer system 100 volume control of WINDOWS-compliant applications can be managed by a bezel button control driver. (WINDOWS is a trademark of Microsoft Corporation.) The bezel button control driver is a device driver which is loaded (made available to execute) from the disk 140 into system RAM 112 when the WINDOWS operating system is loaded. When the bezel button control driver is loaded, it registers with the operating system's BIOS so that other applications and routines can determine that bezel button volume control is available. Bezel button driver registration is generally accomplished by setting a status flag in the NVRAM 108 indicating the driver is loaded.

When the computer system transitions from a WINDOWS operating mode to a Disk Operating System (DOS) operating mode, WINDOWS device drivers such as the bezel button control driver are unloaded (i.e., removed from system RAM 112 and, therefore, not available for execution). Computer system 100 may be placed into the DOS mode by, for example, booting the computer system directly into DOS or by selecting full-screen mode presentation for a DOS application executing in a DOS window under the WINDOWS operating system.

When executing in DOS mode, a peripheral's volume, under program control, may generally only be adjusted by either pausing or halting the application, adjusting the volume, and then restarting the application. Both of these techniques require the user halt the program, an unwanted interruption for many users.

Figure 2:
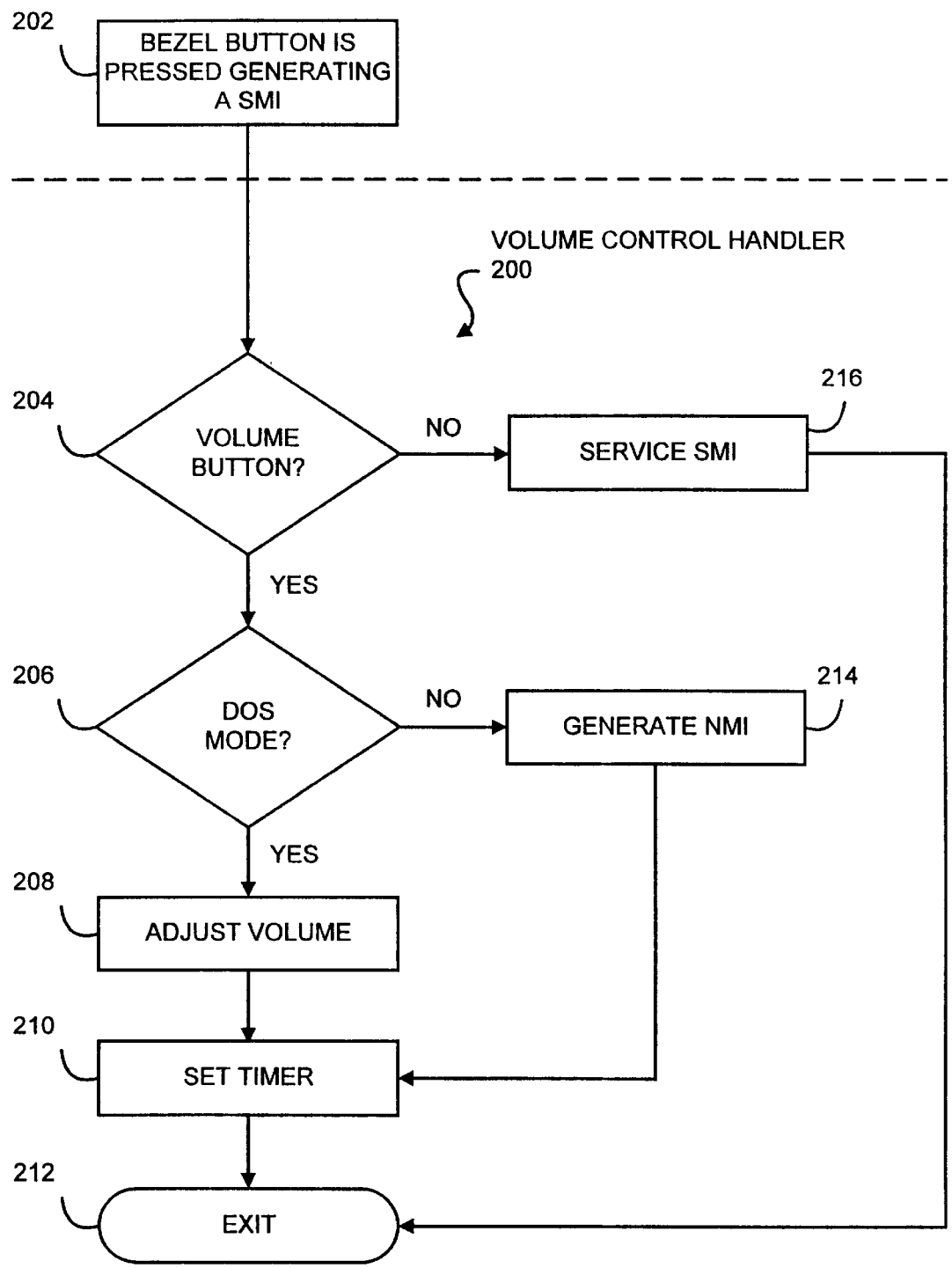
FIG. 2 illustrates a bezel button volume control handler.

Referring to FIG. 2, a volume control handler 200 provides volume control of a peripheral device. The handler 200 is a BIOS routine permanently stored in system ROM 110 and is available for execution whenever the computer system is booted.

Pressing a bezel button generates a SMI (step 202) which, in turn, initiates a routine that interrogates the bezel button hardware. The routine initiated as a result of the SMI determines which button is pressed and initiates execution of the handler 200.

If the depressed bezel button is a volume control button (the 'yes' prong of step 204) and the computer system 100 is operating in the DOS mode (the 'yes' prong of step 206), the volume output of the audio circuit 106 and/or FM synthesizer 108 is adjusted (step 208). If a volume-up bezel button is pressed, the volume is increased by one step. If a volume-down button is pressed, the volume is decreased by one step. If both the volume-up and the volume-down bezel buttons are pushed at the same time, the audio circuit 106 and FM synthesizer 108 are muted. If muted when a volume-up or volume-down button was detected, the mute is canceled and the volume adjusted accordingly. In one embodiment, the audio circuit 106 and FM synthesizer 108 incorporate Sound Blaster compatible registers, a well-known industry standard. The handler 200 can determine if the system is operating in the DOS mode by, for example, checking to see if the WINDOWS bezel button driver is loaded/registered as discussed above.

Once the volume is adjusted at step 208, the volume control handler 200 sets a timer (step 210) and exits (step 212). The timer can be set for any predetermined time period and, in one embodiment, is configured to expire 0.25 seconds (250 msec) after being set. Upon expiration, the timer generates a SMI that initiates execution of the handler 200 at step 204. In this embodiment, the timer implements an auto-repeat function. That is, if the user continues to hold down a volume control bezel button, the volume is adjusted (increased or decreased) every 250 msec.

If the computer system is not operating in the DOS mode (the 'no' prong of step 206), a Non-Maskable Interrupt (NMI) is generated to signal the host processor 102 that the WINDOWS volume control routine (e.g., bezel button driver) should be invoked to process the button event (step 214) and the timer is set as discussed above (step 210).

If the button depressed was not a volume control button (the 'no' prong of step 204), control passes to the routine designed to service the event generating the SMI (step 216) and the volume control handler exits (step 212). On exiting, the handler 200 clears the SMI status so that future SMIs may be processed.

The foregoing description is illustrative only and is not to be interpreted as limiting. It will be recognized that various changes in the details of the illustrated computer system and method of operation may be made without departing from the spirit of the invention. Specifically, the invention is not limited to the WINDOWS and DOS operating systems. The invention may be implemented in digital electronic circuitry or in computer hardware, firmware, software, or in combinations of them. For example, the invention may be implemented, at least in part, as a computer program tangibly embodied in a machine-readable storage device for execution by a computer processor. Method steps according to the invention may be performed by a computer processor executing instructions organized, e.g., into program modules to operate on input data such as a SMI event and to generate output, such as volume control signals. Storage devices suitable for tangible embodying computer program instructions include all forms of non-volatile memory including, but not limited to: semiconductor memory devices such as programmable read only memory (PROM) and flash PROM devices; magnetic disks (fixed, floppy, and removable); other magnetic media such as tape; optical media such as CD-ROM disks; and electro-optic devices.

What is claimed is:

1. A computer system operable in different operating system modes, comprising:

a bus;

a processor operatively coupled to the bus;

a keyboard operatively coupled to the processor via the bus;

an audio device operatively coupled to the bus;

an audio command device separate from the keyboard coupled to the processor, and operable to generate a first type interrupt on actuation of the audio command device;

an audio command controller operatively responsive to the first type interrupt generated by operation of the audio command device to determine in which operating system mode the processor is operating and to generate a second type interrupt when the processor is operating in a first type operating system mode;

a device driver adapted to respond to the second type interrupt to control a parameter of the audio device when the processor is operating in the first operating system mode, the device driver being disabled when the processor is in a second operating system mode;

and wherein the audio command controller is responsive to the first type interrupt to control the parameter of the audio device on determination that the processor is in the second operating system mode.

2. The computer system of claim 1 wherein the parameter is volume.

3. The computer system of claim 2 wherein the audio command device is selectively operable to generate a volume-up or a volume-down command.

4. The computer system of claim 2 wherein the audio command device is selectively operable to generate a mute command.

5. The computer system of claim 3 wherein the audio command device includes separate volume-up and volume-down buttons.

6. The computer system of claim 5 wherein concurrent actuation of the volume-up button and the volume-down button generates a mute command.

7. The computer system of claim 1 wherein the first operating system mode is the WINDOWS mode and the second operating system mode is the DOS mode.

8. The computer system of claim 1 wherein the audio device comprises an audio generator.

9. The computer system of claim 1 wherein the audio device comprises a FM synthesizer.

10. The computer system of claim 1 wherein the first operating system mode is the WINDOWS mode, the second operating system mode is DOS mode, the parameter is volume, the device driver is a WINDOWS device driver, and the audio device includes an audio generator.

11. A computer system operable in different operating system modes, comprising:

a bus;

a processor operatively coupled to the bus;

a keyboard operatively coupled to the processor via the bus;

a audio device operatively coupled to the bus;

an audio command device, separate from the keyboard, coupled to the processor, and operable to generate a first type interrupt on actuation of the audio command device;

an audio command controller operatively responsive to the first type interrupt generated by actuation of the audio command device to determine in which operating system mode the processor is operating and to generate a second type interrupt when the processor is operating in a first type operating system mode;

a device driver adapted to respond to the second type interrupt to control a parameter of the audio device when the processor is operating in the first operating system mode, the device driver being disabled when the processor is operating under a second operating system mode; wherein the audio command controller is responsive to the first type interrupt to control the parameter of the audio device on determination that the processor is operating under the second operating system; and the audio command controller including a timer adapted to generate a time-out signal a specified time period after the audio command controller has adjusted said parameter of the audio device, the time-out signal causing the audio command controller to determine if the audio command device remains actuated.

12. The computer system of claim 11 wherein the parameter is volume.

13. The computer system of claim 12, wherein the audio command device can be selectively actuated to generate a volume-up command or a volume-down command.

14. The computer system of claim 12 wherein the audio command represents a mute command.

15. The computer system of claim 13 wherein the audio command device comprises separate user activated volume-up and volume-down buttons.

16. The computer system of claim 15 wherein concurrent actuation of the volume-up button and the volume-down button generates a mute command.

17. The computer system of claim 11 wherein the first operating system mode is the WINDOWS mode and the second operating system mode is the DOS mode.

18. The computer system of claim 11 wherein the audio device comprises an audio generator.

19. The computer system of claim 11 wherein the audio device comprises a FM synthesizer.

20. The computer system of claim 11 wherein the specified time period is 250 milliseconds.

21. A program storage device readable by a computer system, the computer system capable of operating in a plurality of modes, the program storage device having encoded therein a program of instruction to control a parameter of an audio device in response to actuation of an audio command device, the program including instructions operable to:

respond to a system management interrupt signal generated on actuation of the audio command device to determine the mode of operation of the computer system;

generate a different interrupt signal to invoke an audio device driver to control a parameter of the audio device when the computer system is in a first mode of operation;

respond to the system management interrupt signal to control the parameter of the audio device when the computer system is in a second mode of operation; and generate a second system management interrupt signal a specified time period after control of the parameter of the audio device has been initiated.

22. The program storage device of claim 21 wherein the parameter is volume.

23. The program storage device of claim 22 wherein the audio command signal represents a volume-up command.

24. The program storage device of claim 22 wherein the audio command signal represents a volume-down command.

25. The program storage device of claim 22 wherein the audio command signal represents a mute command.

26. The program storage device of claim 21 wherein the first mode is the WINDOWS operating system mode and the second mode is the DOS operating system mode.

27. The program storage device of claim 21 wherein the specified time period is 250 milliseconds.

28. A method for controlling an audio device parameter in a computer system having a processor capable of operating in a first and second mode, comprising:

receiving a system management interrupt signal by the processor in response to actuation of an audio parameter command device and determining the mode of operation of the computer system;

generating a different interrupt to invoke an audio device driver to control a parameter of the audio device when the processor is in a first mode of operation;

controlling the parameter of the audio device in direct response to the system management interrupt when the processor is in the second mode of operation; and generating a second system management interrupt signal a specified time period after control of the parameter of the audio device has been initiated.

29. The method of claim 28 wherein the parameter is volume.

30. The method of claim 29 wherein the audio command selectively represents a volume-up command or a volume-down command.

31. The method of claim 29 wherein the audio command represents a mute command.

32. The method of claim 30 wherein the volume-up command is initiated by a user activating a volume-up button adapted to generate the system management interrupt signal.

33. The method of claim 1 wherein the volume-down command is initiated by a user activating a volume-down button adapted to generate the system management interrupt signal.

34. The method of claim 31 wherein the mute command is initiated by a user activating a volume-up button concurrently with activating a volume-down button to generate the system management interrupt signal.

35. The method of claim 28 wherein the first mode is the WINDOWS operating system mode and the second mode is the DOS operating system mode.

36. The method of claim 28 wherein the device comprises an audio generator.

37. The method of claim 28 wherein the device comprises a FM synthesizer.

38. The method of claim 28 wherein the specified time period is 250 milliseconds.

* * * * *